(12) United States Patent
Goode et al.

(10) Patent No.: US 7,285,852 B2
(45) Date of Patent: Oct. 23, 2007

(54) SEMICONDUCTOR DEVICE CAPSULE (75) Inventors: Andrew Goode, Stafford (GB); John Ballad, Hillcroft Park (GB)

(73) Assignee: Areva T&D SA, Paris (FR)

( * ) Notice: Subject to any disclaimer, the term of this patent is extended or adjusted under 35 U.S.C. 154(b) by 0 days.

(21) Appl. No.: 11/149,573

(22) Filed: Jun. 9, 2005

(65) Prior Publication Data
US 2006/0087027 A1    Apr. 27, 2006

(30) Foreign Application Priority Data
Jun. 9, 2004    (GB) ................................ 0412778.3

(51) Int. Cl.
*H01L 23/34* (2006.01)
(52) U.S. Cl. .................. 257/718; 257/719; 257/E23.11
(58) Field of Classification Search ................ 257/718, 257/707, 717, 719
See application file for complete search history.

(56) References Cited

U.S. PATENT DOCUMENTS

| 5,866,944 | A | * | 2/1999 | Hiyoshi et al. ............. 257/719 |
| 6,373,133 | B1 | * | 4/2002 | DiGiacomo et al. ........ 257/713 |
| 6,490,161 | B1 | * | 12/2002 | Johnson ...................... 361/704 |
| 6,552,266 | B2 | * | 4/2003 | Carden et al. ............. 174/52.4 |
| 2004/0021149 | A1 | | 2/2004 | Kitazawa et al. | |

FOREIGN PATENT DOCUMENTS

JP    09-275186    10/1997

* cited by examiner

*Primary Examiner*—Evan Pert
*Assistant Examiner*—Benjamin P. Sandvik
(74) *Attorney, Agent, or Firm*—Thelen Reid Brown Raysman & Steiner LLP (57) ABSTRACT

A semiconductor device capsule comprising a semiconductor assembly mounted between opposed poles. At least one of the poles includes slots around the locality of the or each chip or group of chips within the semiconductor assembly to define a contact body portion on which the or each chip or group of chips is mounted and reduce the thickness of a laterally continuous body portion of the pole.

14 Claims, 6 Drawing Sheets

SEMICONDUCTOR DEVICE CAPSULE

CROSS-REFERENCE TO RELATED APPLICATION

This application claims priority to United Kingdom Application No. 0412778.3, filed on Jun. 9, 2004, entitled: "Semiconductor Device Capsule" by Andrew Goode and John Ballad and was not published in English.

TECHNICAL FIELD

The present invention relates to a semiconductor device capsule and, in particular, a multi-chip pressure contact semiconductor device capsule.

BACKGROUND

Figure 1:
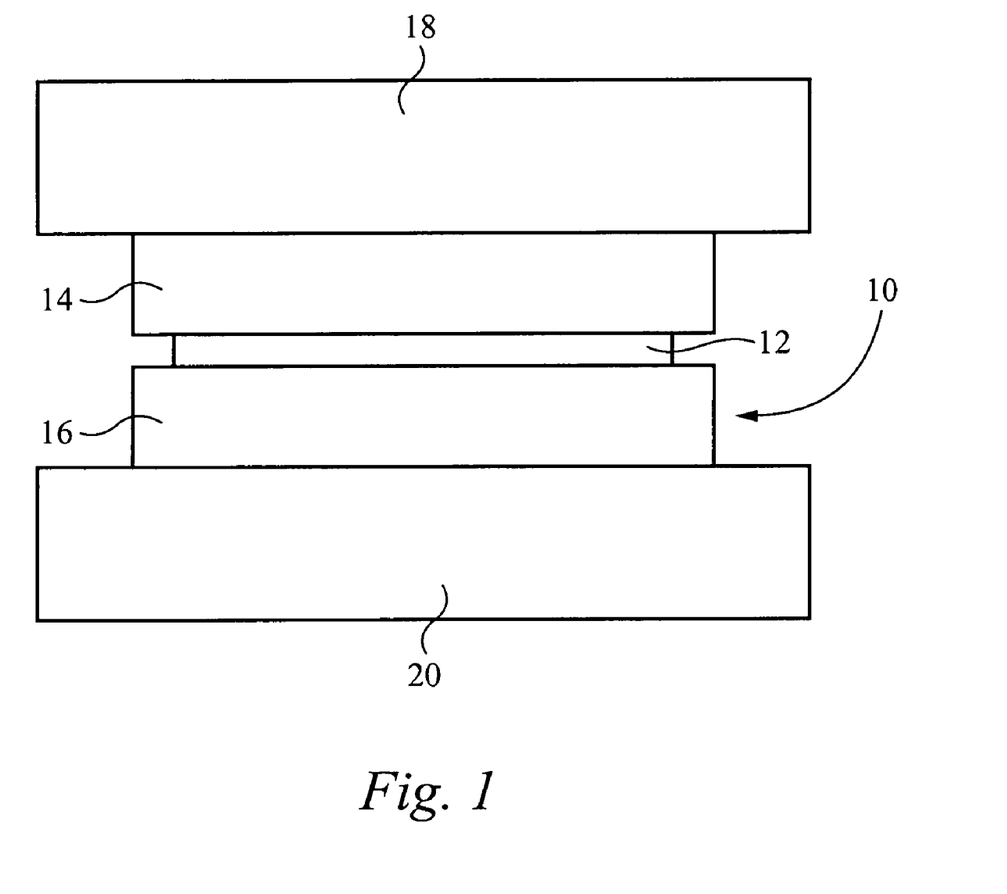
FIG. 1 shows a semiconductor device capsule located between two heat sinks.

Pressure-contact semiconductor device capsules 10 are often used in electricity transmission and distribution infrastructures, and typically include a semiconductor assembly 12 mounted between two opposed poles 14,16, as shown in FIG. 1. The semiconductor assembly 12 and poles 14,16 are usually provided within an insulating (e.g. ceramic) enclosure (not shown).

In use, the capsule 10 is subject to a compressive mechanical clamping force to ensure good thermal, electrical and mechanical contact between the semiconductor assembly 12 and the poles 14,16. This force is usually applied through heat sinks 18,20 and/or solid surface plates placed either side of the capsule 10.

Figure 2:
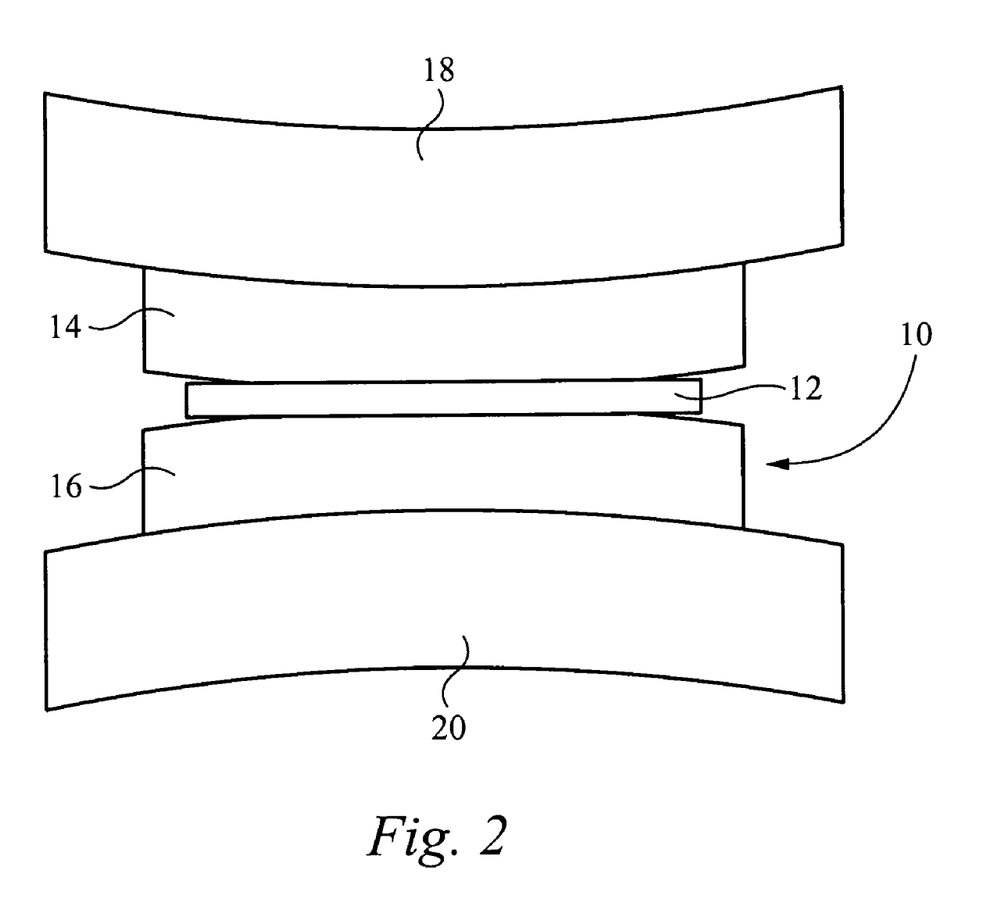
FIG. 2 illustrates bending of the semiconductor device capsule and heat sinks of FIG. 1 during use.

During operation, the semiconductor assembly 12 generates heat, thereby heating the lower surface of the top pole 14 and the upper surface of the bottom pole 16. The upper surface of the top pole 14 and the lower surface of the bottom pole 16 are cooled by the heat sinks 18,20. This creates a thermal gradient and, as a result, causes the top and bottom poles 14,16, and other parts of the assembly, to bend in opposite directions, as illustrated in FIG. 2.

This bending alters the thermal, electrical and mechanical contact between the semiconductor assembly 12 and the poles 14,16. This is the case even when the junction temperature is limited to 125° C., as in the case of silicon-based semiconductor assemblies. When junction temperatures of 250° C. are permissible, as with semiconductor assemblies based on silicon carbide, higher heat flux results in greater thermal deformation.

In circumstances where the semiconductor assembly includes a single, and often large diameter wafer, the metallization of the semiconductor wafer, typically evaporated or sputtered aluminium, is conformable and is usually of sufficient thickness to compensate for the effects of bending. Contact between the wafer and the poles may be improved by interposing molybdenum or tungsten plates of intermediate expansion coefficient. In circumstances where the semiconductor assembly includes a large diameter wafer, the provision of molybdenum or tungsten plates also lessens the likelihood of the wafer cracking.

However, in circumstances where the semiconductor assembly includes a multiplicity of separate chips, bending results in poor distribution of thermal, electrical and mechanical contact, particularly near the circumference of the capsule. This causes poor equality of contact between the constituent chips, and results in electrical duty being concentrated on the chips located at the centre of the capsule. The chips located at the centre of the capsule may therefore overheat and fail.

Contact between each of the chips and the poles may be improved by locating a spring on one side of each of the chips to provide a spring bias. However, this means that heat flux can only flow effectively from one side of each of the chips since heat transfer through the springs is very much reduced compared to standard contact methods.

Contact between each of the chips and the poles may also be improved by increasing the compressive mechanical clamping force in order to press flat the distortion caused by the thermo-mechanical bending of each pole. However, it is known that the magnitude of the compressive mechanical clamping force is limited since it is important not to damage the semiconductor chips. If the clamping force exceeds a predetermined value, the structure of the semiconductor chips will be damaged.

It is also known from analysis and modelling that the magnitude of the compressive mechanical clamping force required to press flat the distortion caused by the thermo-mechanical bending of each pole is dependent on, and increases markedly with, the thickness of the pole. However, it is important to ensure that the poles are sufficiently thick that the depth of the capsule is not less than approximately 25 mm (and preferably somewhat thicker). This ensures that the insulation provided by the ceramic enclosure around the capsule has adequate jump and creepage distance. The creepage distance is provided by forming the ceramic with sufficiently deep sheds. This thickness requirement translates into the need to use poles which have an overall thickness of at least 10 mm.

SUMMARY

An aim of the invention is to provide a pressure-contact semiconductor device capsule where equality of contact between the or each chip or group of chips within the semiconductor assembly and the poles is maintained during use throughout the whole temperature range permitted by the electrical properties of the semiconductor.

According to an aspect of the invention, there is provided a semiconductor device capsule comprising a semiconductor assembly mounted between opposed poles wherein at least one of the poles includes slots around the locality of the or each chip or group of chips within the semiconductor assembly to define a contact body portion on which the or each chip or group of chips is mounted and reduce the thickness of a laterally continuous body portion of the pole.

BRIEF DESCRIPTION OF THE DRAWINGS

An embodiment of the invention will now be described, by way of a non-limiting example, with reference to the accompanying drawings in which.

DETAILED DESCRIPTION

Figure 3:
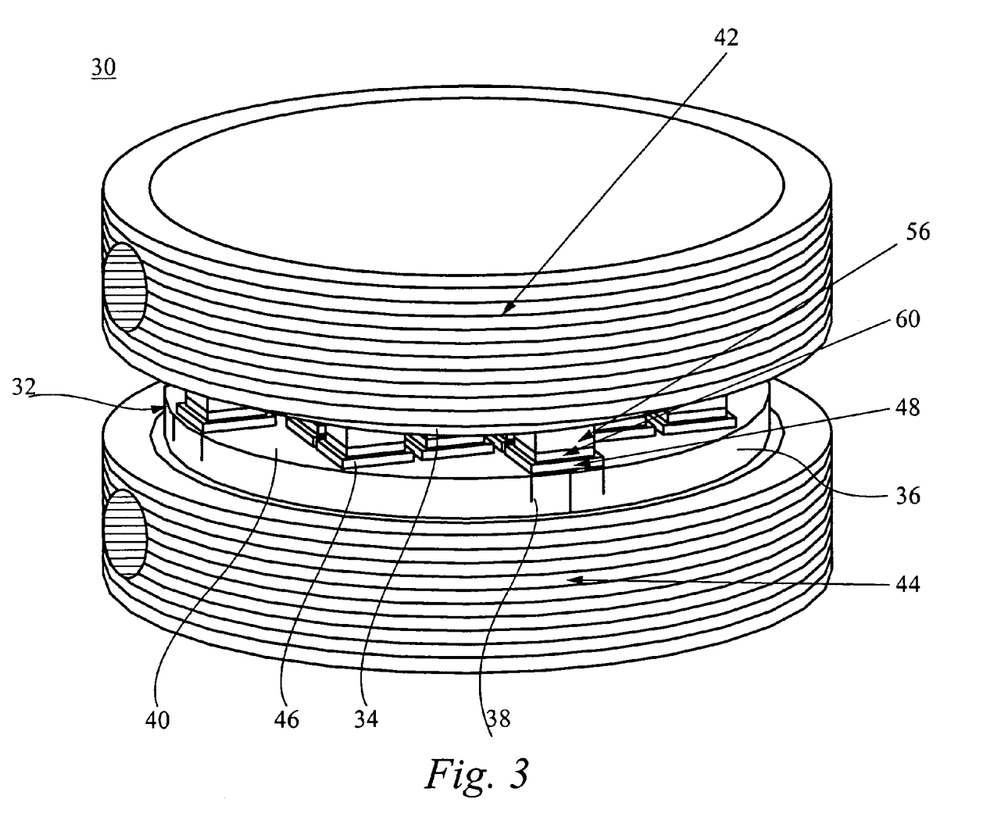
FIG. 3 shows a semiconductor device capsule according to an embodiment of the invention located between two heat sinks.

A pressure-contact semiconductor device capsule 30 according to an embodiment of the invention is shown in FIG. 3. The semiconductor device capsule 30 includes a semiconductor assembly 32 located between opposing top and bottom poles 34,36.

The semiconductor assembly 32 and poles 34,36 are preferably located within an insulating (e.g. ceramic) enclosure (not shown).

Each of the poles 34,36 is preferably a solid member formed from copper having an overall depth of approximately 10 mm or greater.

Figure 4:
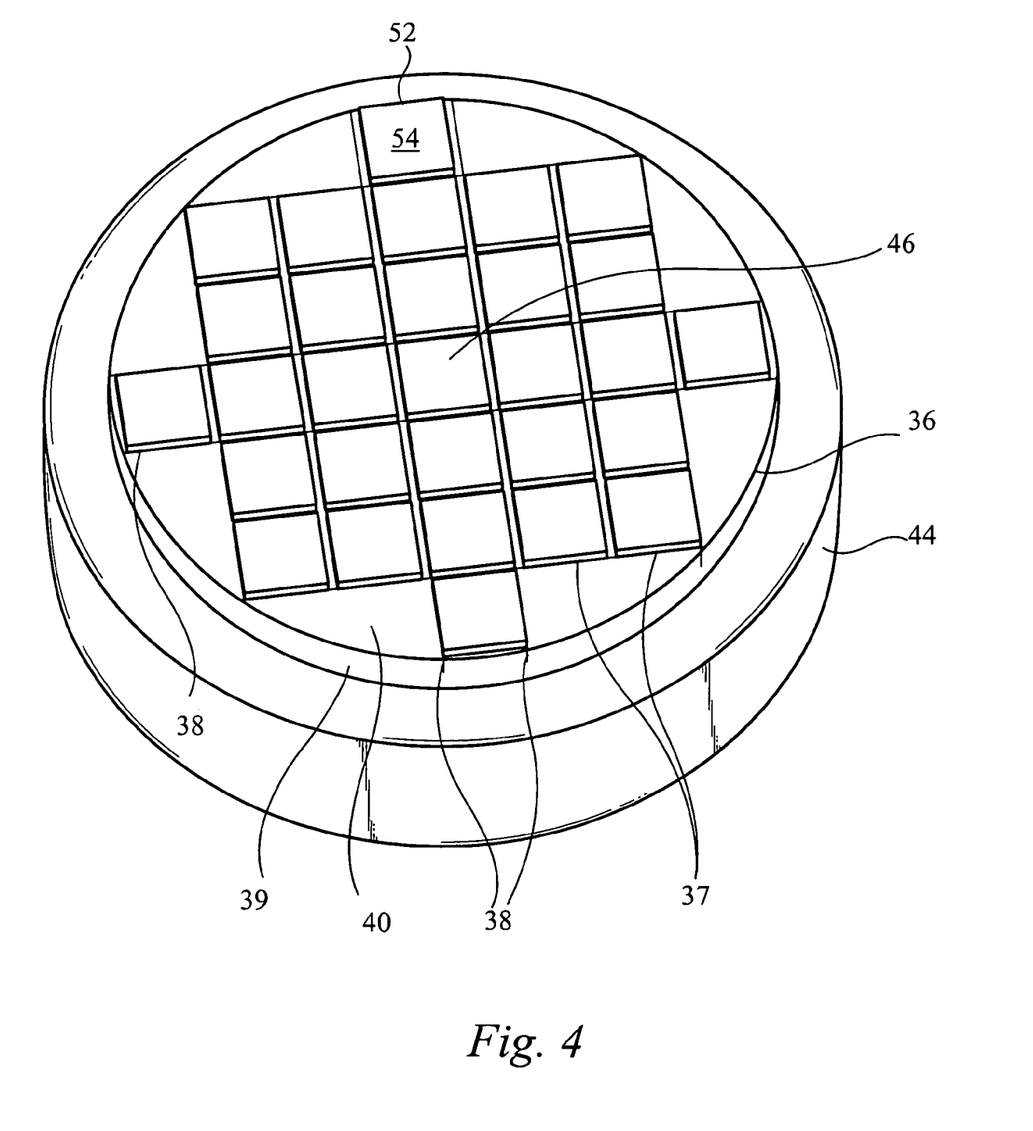
FIG. 4 shows a bottom part of the semiconductor device capsule of FIG. 3 and the underlying heatsink.
Figure 5:
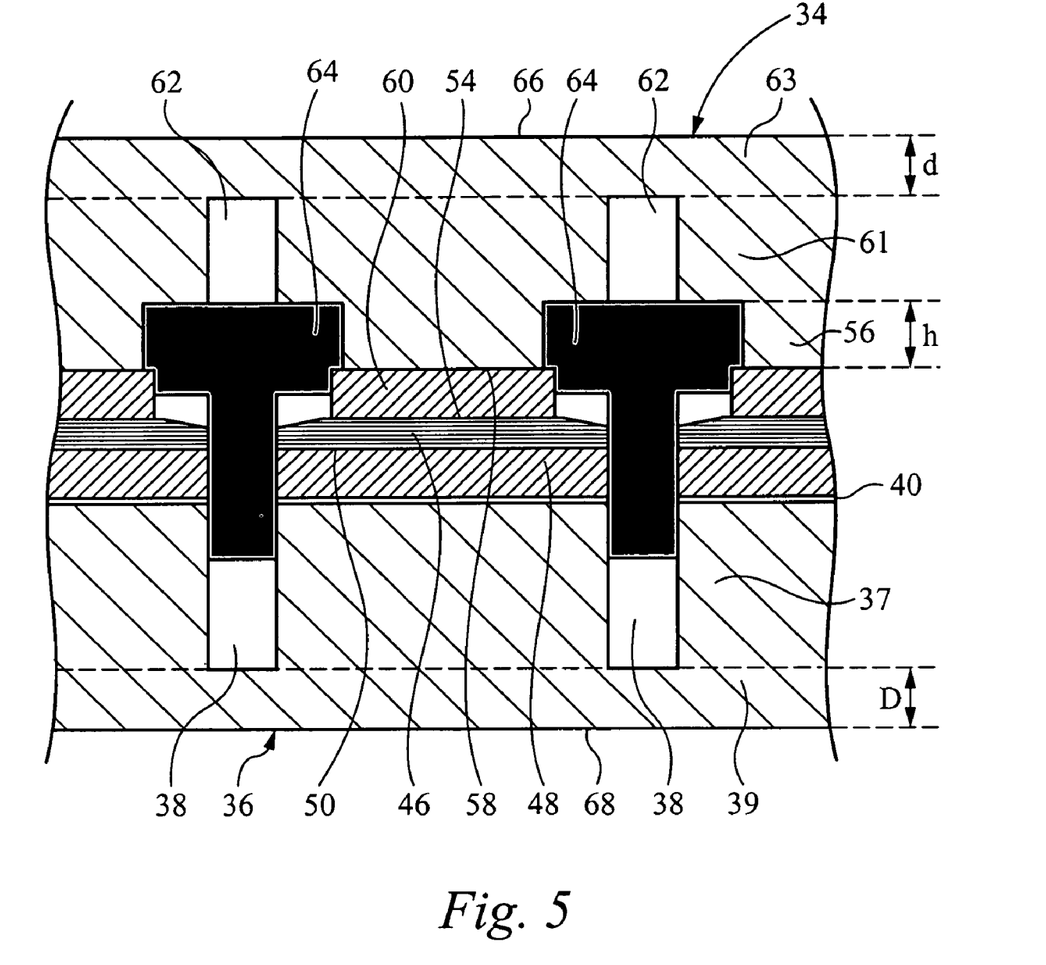
FIG. 5 shows a cross-sectional view through a semiconductor device chip of the semiconductor device capsule of FIG. 3.

Slots 38 (FIGS. 4 and 5) are formed in an upper surface 40 of the bottom pole 36 around the circumference of the or each chip or group of chips 46 within the semiconductor assembly 32. Each slot 38 extends part-way through the solid pole 36 to form a contact body portion 37 on which the or each chip or group of chips 46 is mounted. Since the slots 38 do not extend through the entire depth of the pole 36, a laterally continuous portion 39 of the pole 36 is retained beneath the contact body portion 37, the laterally continuous portion 39 of the pole 36 having a thickness D (FIG. 5). The depth of the slots 38 is preferably chosen such that the thickness D of the laterally continuous portion 39 is preferably approximately 3 mm.

In use, the capsule 30 is subject to a compressive mechanical clamping force to ensure good thermal, electrical and mechanical contact between the semiconductor assembly 32 and each of the poles 34,36. This force is preferably applied through heat sinks 42,44 placed either side of the capsule 30.

In the embodiment shown in FIG. 3, the semiconductor assembly 32 includes a plurality of semiconductor chips 46. The chips 46 are preferably arranged on the upper surface 40 of the bottom pole 36 in a grid-like or orthogonal pattern, one such arrangement being shown in FIG. 4. In this arrangement, the slots 38 are preferably arranged to extend across the upper surface 40 of the bottom pole 36 so as to form the intervening lines of a grid and define a plurality of contact body portions 37 on which the semiconductor chips 46 are mounted.

An expansion matching plate 48 formed from a material having an intermediate expansion coefficient, such as, for example, molybdenum or tungsten, is preferably interposed between the bottom face 50 of each of the chips 46 and the upper surface 40 of the bottom pole 36, as shown in FIG. 5.

The periphery 52 of the top face 54 of each of the semiconductor chips 46 may be required for edge passivation to preserve the voltage withstand at the chip edge. This means that the top face 54 of each of the semiconductor chips 46 may have a smaller contact area than the bottom face 50. To allow for this, the top pole 34 preferably includes a plurality of pillars 56 protruding from a lower surface 58 thereof. The pillars 56 correspond in number and position to the chips 46 located between the top and bottom poles 34,36.

The height h (FIG. 5) of each of the pillars 56 is preferably about 3 mm to 10 mm. This height is sufficient to accommodate the chip passivation without increasing unduly the thermal resistance of the top pole 34.

Preferably, a further expansion matching plate 60 formed from a material having an intermediate expansion coefficient, such as, for example, molybdenum or tungsten, is interposed between the top face 54 of each of the chips 46 and a respective pillar 56, as shown in FIG. 5.

In the embodiment shown in FIG. 3, slots 62 are formed in the lower surface 58 of the top pole 34 about the circumference of each of the semiconductor chips 46. Each slot 62 extends part-way through the solid pole 34 to form contact body portions 61 on which the semiconductor chips 46 are mounted. Since the slots 62 do not extend through the entire depth of the pole 34, a laterally continuous portion 63 of the pole 34 is retained beneath the contact body portions 61, the laterally continuous portion 63 of the pole 34 having a thickness d (FIG. 5). The depth of the slots 62 is preferably chosen such that the thickness d of the laterally continuous portion 63 is preferably approximately 3 mm.

In other embodiments, slots may be formed on only one of the poles 34,36.

The depths of the slots in the top and/or bottom pole 34,36 and the thicknesses of the laterally continuous portions of the poles 63,39 may be varied depending on the expected generation of heat flux from the semiconductor assembly 32.

The width of each of the slots 38,62 formed in the top and bottom poles 34,36 is at least 1 mm, and is preferably several millimetres. The provision of slots 38 which are several millimetres wide in the bottom pole 36 allows chip-locator members 64 to be inserted at one end into the slots 38, as shown in FIG. 5. Each of the chip-locators 64 is preferably shaped to correspond to the shape of the intervening space between the poles 34,36 so that the other end of the chip-locator protrudes into the space separating adjacent pillars of the top pole 34.

The use of chip-locator members 64 assists in maintaining the relative positions of the individual components associated with each chip 46.

In other embodiments, chip location may be achieved by means of a continuous plate having apertures therein. In such embodiments, the plate may be lain over the poles so that the poles extend through respective apertures.

In use, the compressive mechanical clamping force, preferably applied through the heat sinks 42,44, maintains the chips 46, expansion matching plates 48,60, bottom pole 36 and pillars 56 in contact with each other. This contact may be enhanced by bonding each of the chips 46 to one or both of the expansion matching plates 48,60. The expansion matching plates 48,60 are preferably in sliding contact with the bottom pole 36 and pillars 56 respectively so as to allow relative movement therebetween.

The electrical behaviour of the semiconductor chips 46 in use generates heat. This heat is transferred to the lower surface 58 of the top pole 34 and the upper surface 40 of the bottom pole 36. The upper surface 66 of the top pole 34 and the lower surface 68 of the bottom pole 36 are cooled by the heat sinks 42,44. This creates a thermal gradient across the capsule 30.

However, the provision of slots 38,62 in each of the poles 34,36 to define contact body portions 37,61 means that the upper and lower surfaces 40,58 of the respective contact body portions 37,61 can expand, reducing the distance between adjacent contact body portions 37,61.

Figure 6:
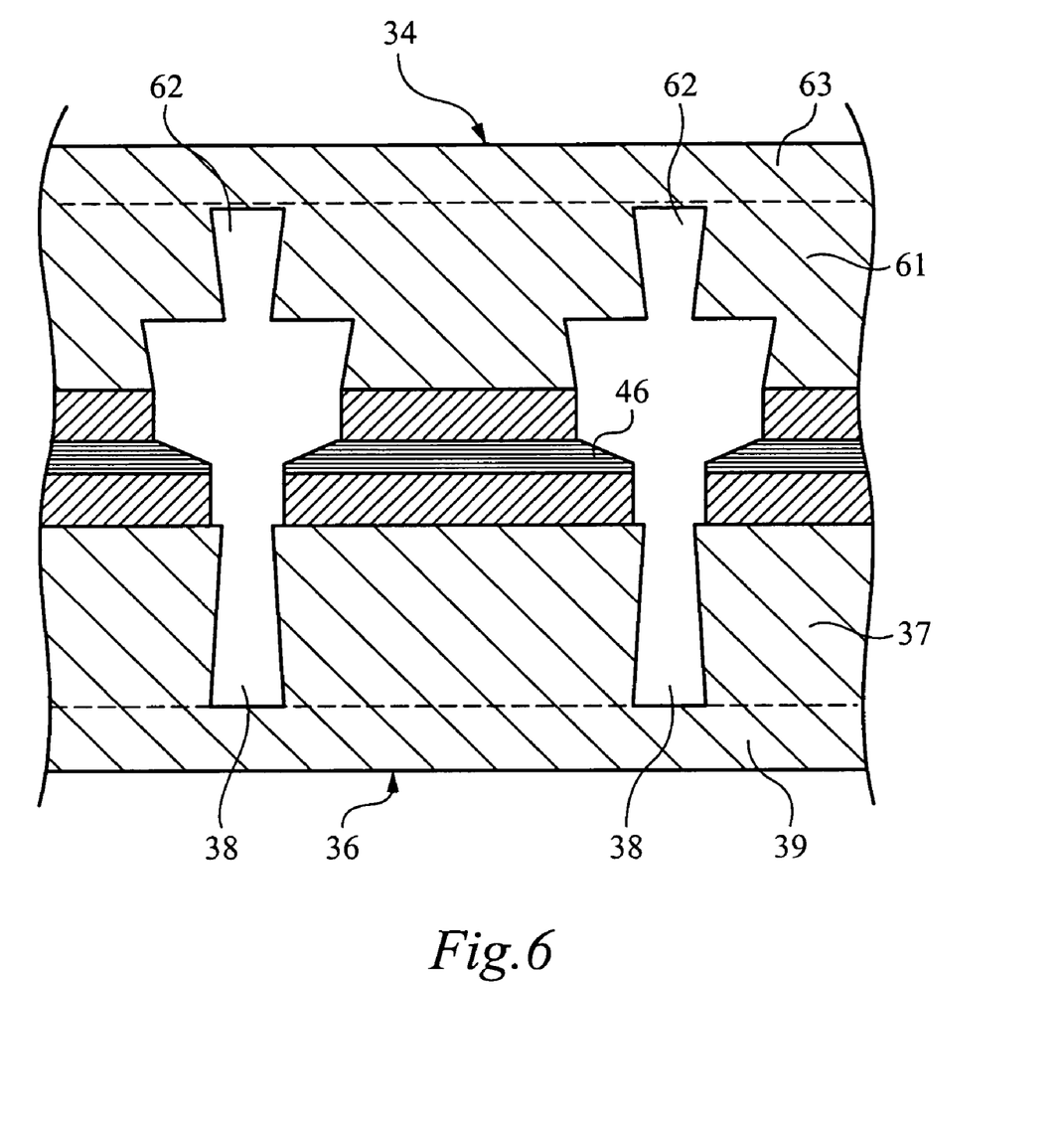
FIG. 6 shows the same cross-sectional view as FIG. 5, and illustrates the effect of the thermal gradient produced in the semiconductor device capsule of FIG. 3 during use.

The thermal gradient means that the amount of thermal expansion of each of the contact body portions 37,61 reduces with distance from the chips, as shown in FIG. 6. The provision of the slots 38,62 means that bending of the laterally continuous portions 39,63 is minimized.

The provision of the slots 38,62 also reduces the lateral rigidity of each of the poles 34,36 by reducing the thickness d,D of the laterally continuous portions 63,39 of the poles 34,36, whilst maintaining the axial rigidity. It therefore reduces the size of the clamping force required to press the poles 34,36 flat.

It is preferable that the thickness of the laterally continuous portions 63,39 of the poles 34,36 is typically 3 mm. A substantially greater thickness than this, e.g. 5 mm, would lead to greater thermo-mechanical distortion at elevated temperatures. This is unacceptable because it results in poor distribution of contact between the multiplicity of chips in a large multi-chip capsule with typically 125 mm diameter poles. A substantially reduced thickness, e.g. less than 1 mm, could result in shortening of the capsule life due to fatigue stress.

This increases the likelihood that the compressive mechanical clamping force used to maintain contact between the components of the capsule 30 is large enough to keep the poles 34, 36 flat. As discussed previously, the size of the compressive mechanical clamping force is limited by the semiconductor chips 46. If the clamping force exceeds a certain value, the structure of each of the chips 46 may be damaged.

The slots 38,62 have negligible effect on the electrical and thermal behaviour of the capsule 30 because the main current and heat flows are vertical, and the slots 38,62 only obstruct horizontal flows. The remaining laterally continuous portions 63,39 of each pole 34,36 is adequate to cope with any horizontal flows there are.

Reducing the effect of the thermal gradient created across the capsule 30 during use means that it is possible to introduce a range of high power semiconductor devices based on silicon carbide technology using large-diameter, multi-chip capsules, which give the highest ratings possible.

In this way, it is possible to satisfactorily operate devices having pole diameters as high as approximately 125 mm at junction temperatures of about 250° C. Such devices may contain typically 30 chips, each having an active surface area of 100 mm$^2$, or a higher number of chips having a smaller surface area (or a smaller number of chips having a larger surface area when the development of silicon carbide wafer material permits).

When the effects of thermo-mechanical bending are not reduced, the practical size of the device may be limited to 50 mm pole diameter for the same heat flux per chip, which would accommodate only 4 such chips, so necessitating the connecting of approximately 7 such capsules in parallel to achieve the same power rating.

The invention claimed is:

1. A semiconductor device capsule comprising a pair of opposed poles, each pole including a plurality of slots arranged to define respective contact body portions opposite one another and corresponding to a respective chip or group of chips, each contact body portion having a discrete expansion matching plate of intermediate expansion coefficient lying adjacent thereto, corresponding expansion matching plates having a respective chip or group of chips sandwiched therebetween, each pole having a laterally continuous body portion thickness of approximately 3 mm.

2. A semiconductor device capsule according to claim 1 wherein each of the poles is a solid member formed from copper.

3. A semiconductor device capsule according to claim 1 wherein each pole has a depth of 10 mm.

4. A semiconductor device capsule according to claim 1 wherein the semiconductor assembly includes a plurality of semiconductor chips arranged in a grid-like pattern.

5. A semiconductor device capsule according to claim 4 wherein the slots around the locality of each chip or group of chips are arranged so as to form the intervening lines of the grid and define a plurality of contact body portions on which the chips are mounted.

6. A semiconductor device capsule according to claim 1 wherein each expansion matching plate is formed from molybdenum or tungsten.

7. A semiconductor device capsule according to claim 1 wherein one of the poles includes one or more pillars protruding from its inner surface between the inner surface of the pole and respective expansion matching plates lying adjacent thereto.

8. A semiconductor device capsule according to claim 7 wherein each pillar has a height of 3 mm to 10 mm.

9. A semiconductor device capsule according to claim 1 further including one or more locator members received at each end in a slot formed in each pole so as to extend between the poles.

10. A semiconductor device capsule according to claim 1, wherein a degree of flexure of the poles under a clamping force is increased to maintain adequate thermal and electrical contact to each chip or group of chips within the capsule.

11. A semiconductor device capsule comprising a pair of opposed poles, each pole including a plurality of slots arranged to define respective contact body portions opposite one another and corresponding to a respective chip or group of chips, each contact body portion having a discrete expansion matching plate of intermediate expansion coefficient lying adjacent thereto, corresponding expansion matching plates having a respective chip or group of chips sandwiched therebetween, each pole having a laterally continuous body portion and one or more locator members extending in corresponding slots around each chip of the opposing poles.

12. A semiconductor device capsule comprising:
   a first pole having a plurality of first contact body portions each configured to receive an entire chip on a first surface, each first contact body portion having first slots around the first surface along its edges to separate the chip from an adjacent entire chip on an adjacent first contact body portion, wherein the first slots extend from the first surface to a first laterally continuous body portion of the first pole; and
   a second pole having a plurality of second contact body portions each having a second surface configured to interface with a respective chip on the first contact body portions, each second contact body portion having second slots in communication with respective first slots of the first contact body portion, wherein the second slots extend from the second surface to a second laterally continuous body portion of the second pole, wherein each chip does not laterally extend beyond the first and second slots of its respective first and second contact body portions.

13. A semiconductor device capsule comprising:
   a first pole having a plurality of first contact body portions each configured to receive an entire chip on a first surface, each first contact body portion having first slots around the first surface along its edges, wherein the first slots extend from the first surface to a first laterally continuous body portion of the first pole;
   a second pole having a plurality of second contact body portions each having a second surface configured to interface with a respective chip on the first contact body portions, each second contact body portion having second slots in communication with corresponding first slots, wherein the second slots extend from the second surface to a second laterally continuous body portion of the second pole; and
   a locator member configured to extend through the communicating first and second slots, wherein the locator member is positioned between adjacent chips when the first and second pole are coupled to one another.

14. A semiconductor device capsule comprising:

a first pole having a plurality of first contacting body portions each configured to receive a chip on a first surface, each first contact body portion having first slots around the first surface along its edges to separate the chip from an adjacent chip on an adjacent first contact body potion, wherein the first slots extend from the first surface to a first laterally continuous body portion of the first pole;

a second pole having a plurality of second contact body portions each having a second surface configured to interface with corresponding chips on the first contact body portions, each second contact body portion having second slots in communication with respective first slots of the first contact body portion, wherein the second slots extend from the second surface to a second laterally continuous body portion of the second pole, wherein the first laterally continuous body portion and second laterally continuous body portion each have a thickness dimension of approximately 3 mm.

* * * * *